US006138254A

United States Patent [19]

Voshell

[11] Patent Number: 6,138,254

[45] Date of Patent: Oct. 24, 2000

[54] METHOD AND APPARATUS FOR REDUNDANT LOCATION ADDRESSING USING DATA COMPRESSION

[75] Inventor: Thomas W. Voshell, Boise, Id.

[73] Assignee: Micron Technology, Inc., Boise, Id.

[21] Appl. No.: 09/012,036

[22] Filed: Jan. 22, 1998

[51] Int. Cl.[7] .................... G11C 29/00

[52] U.S. Cl. .................... 714/710; 710/68

[58] Field of Search .................... 714/718, 723, 714/737, 710, 711; 710/68

[56] References Cited

U.S. PATENT DOCUMENTS

| | | | |
|---|---|---|---|
| 4,290,105 | 9/1981 | Cichelli et al. | 364/200 |
| 4,628,509 | 12/1986 | Kawaguchi | 371/21 |
| 5,276,834 | 1/1994 | Mauritz et al. | 395/425 |
| 5,317,573 | 5/1994 | Bula et al. | 371/10.3 |
| 5,363,382 | 11/1994 | Tsukakoshi | 371/21.2 |
| 5,373,290 | 12/1994 | Lempel et al. | 341/51 |
| 5,410,671 | 4/1995 | Elgamal et al. | 395/425 |
| 5,632,024 | 5/1997 | Yajima et al. | 395/381 |
| 5,781,486 | 7/1998 | Merritt | 365/201 |
| 5,996,096 | 11/1999 | Dell et al. | 714/710 |
| 6,035,432 | 3/2000 | Jeddeloh | 714/763 |

*Primary Examiner*—Albert De Cady
*Assistant Examiner*—Samuel Lin
*Attorney, Agent, or Firm*—Dorsey & Whitney LLP

[57] ABSTRACT

A method and apparatus for identifying defective cells in a memory array includes receiving a request for accessing an address and analyzing the address to determine when the address matches an address stored in a temporary memory array. When the address does not match any address stored in the temporary memory array, a wait instruction is sent to a processor and the address is analyzed to determine which portion of compressed data stored in a map memory array to decompress. The map memory array stores data containing compressed addresses of defective cells in a first memory array. The portion of compressed data is then decompressed to provide expanded data when the address does not match any address stored in the temporary memory array. The expanded data are then written to the temporary memory array, and the expanded data are compared to the address to determine when the address corresponds to an expanded datum of the expanded data.

36 Claims, 5 Drawing Sheets

METHOD AND APPARATUS FOR REDUNDANT LOCATION ADDRESSING USING DATA COMPRESSION

TECHNICAL FIELD

This invention generally concerns memory arrays, and more particularly, techniques for identifying and substituting for defective locations in memory arrays.

BACKGROUND OF THE INVENTION

Memory arrays consist of a number of storage locations or memory cells. Memory arrays are generally coupled to a storage control unit for accessing storage locations (cells) in order to store information in, or to retrieve information from, the memory array. Memory arrays are generally constructed in a reliable and robust manner. However, some random number of memory locations may be or become defective. It is desirable to avoid storing data to, or retrieving data from, defective memory locations. In order to avoid accessing defective memory locations, a memory map is generally devised to map addresses for defective memory array cells to another memory array or another portion of the memory array that is known to be operative. This memory array or portion is commonly referred to as a spare or a redundant memory array. The memory map is stored in another memory array, known as the map memory array. The size required for the spare and map memory arrays depends on the number of defective memory cells to be replaced. If the primary or first memory array requires that all locations be spared, the spare memory array will need to be as large as the first memory array and the map memory array will also need to be large. Since relatively few locations in the first memory array usually are defective, the size of the spare memory array is usually far less than the size of the primary or first memory array. It is desirable, of course, to make the spare and map memory arrays as small as possible, as unused locations dedicated to spare or map memory are wasted and this wastes resources. In order to maximize the efficient use of memory resources, there is need for a method and corresponding apparatus for reducing the amount of data to be stored in the map memory array.

SUMMARY OF THE INVENTION

Briefly stated, in a first embodiment, the present invention contemplates a method for identifying defective cells in a memory array. The method includes steps of receiving a request for accessing an address and analyzing the address to determine when the address matches an address stored in a temporary memory array. When the address does not match any address stored in the temporary memory array, the method includes steps of sending a wait instruction, analyzing the address to determine which portion of compressed data stored in a map memory array to decompress and decompressing the portion of compressed data to provide expanded data. The method also includes steps of writing the expanded data to the temporary memory array and comparing the expanded data to the address to determine when the address corresponds to an expanded datum of the expanded data.

In a second embodiment, the present invention includes a method for accessing a memory array. The method includes steps of requesting an address for one or more memory array cells comprising a first memory array and comparing the address to decompressed data describing defective memory array cells in the first memory array to determine when the address and a datum from the decompressed data match. The method includes a step of routing the address to a second memory array when the address and a datum from the decompressed data match.

In a third embodiment, the present invention includes a method for accessing a memory array. The method includes steps of receiving a memory array access request including a requested address, generating a first hash code from the requested address and comparing the first hash code to hash codes for decompressed addresses stored in a temporary memory array. When a match is found between a hash code for a decompressed address and the first hash code, the method includes a step of routing the memory array address request to a spare memory array.

Another embodiment of the present invention includes a memory control circuit. The memory control circuit includes a storage control unit coupled to a bus. The storage control unit accesses memory array units to retrieve data from a first memory array unit in response to memory array access requests delivered via the bus. The memory control circuit also includes a first memory array coupled to the storage control unit. The first memory array is for temporarily storing data. The memory control circuit additionally includes a second memory array coupled to the storage control unit. The second memory array provides cells for replacing cells determined to be defective in the first memory array. The memory control circuit further includes a data compression circuit that compresses data describing memory array addresses corresponding to cells determined to be defective in the first memory array to provide compressed addresses. The data compression circuit also decompresses compressed addresses to provide decompressed addresses. The data compression circuit couples to the storage control unit.

DETAILED DESCRIPTION OF THE INVENTION

Figure 1:
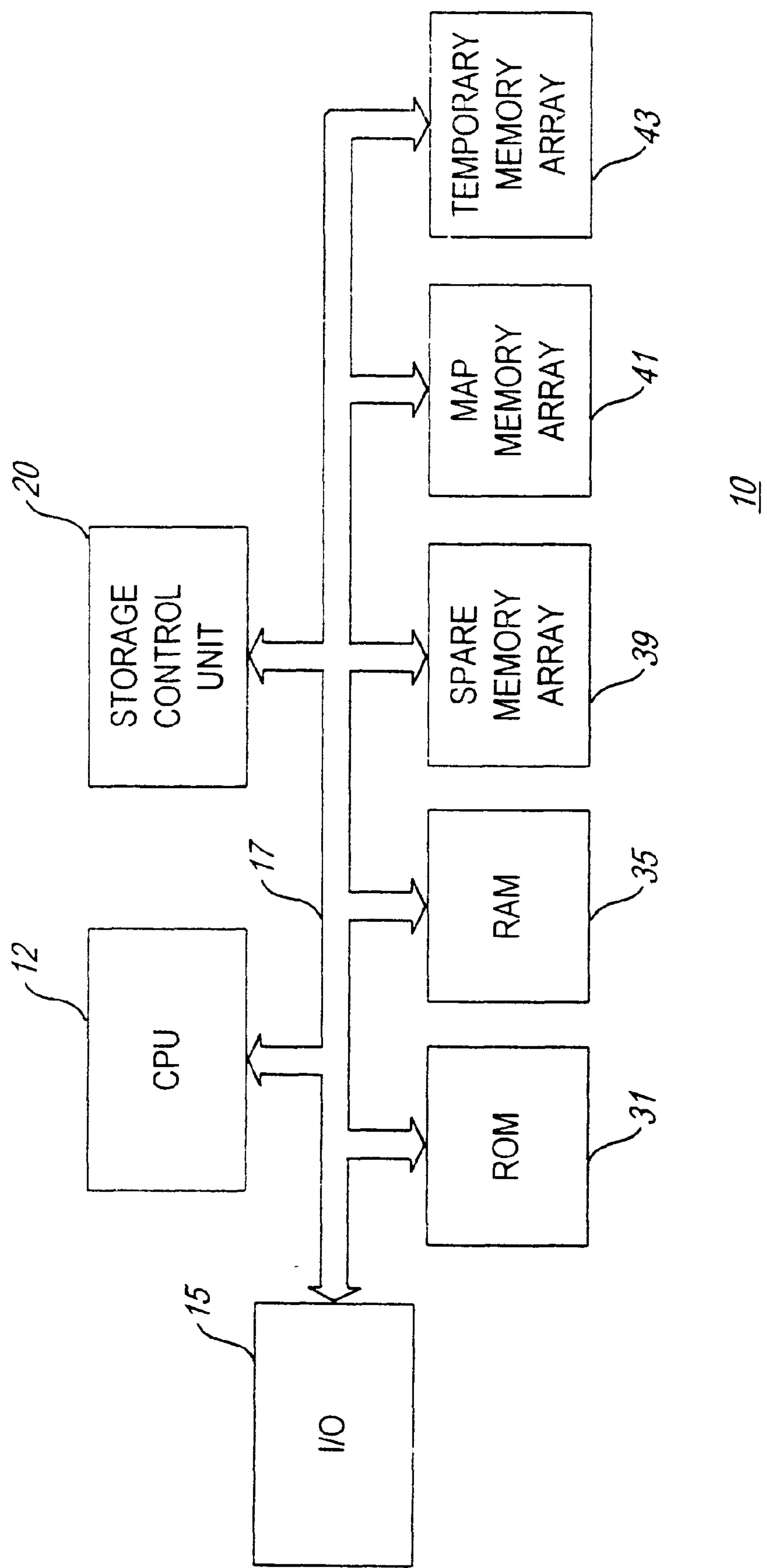
FIG. 1 is a block diagram of a computer system employing a compression engine in accordance with an embodiment of the present invention.

FIG. 1 is a block diagram of a computer system 10 that uses one embodiment of the present invention. The computer system 10 includes a central processing unit or CPU 12 coupled by a bus 17 to an input/output or I/O device 15 and to a storage control unit 20. In a preferred embodiment, the CPU 12 may be a 68040 processor available from Motorola of Phoenix, Ariz. or a Pentium® processor available from Intel of Santa Clara, Calif. I/O device 15 may comprise a keyboard, one or more disk data storage units, a display, a printer or coupling to external data sources such as a local area network or the like.

The storage control unit 20 couples via the bus 17 to a collection of memory devices including ROM 31, RAM 35

(i.e., the primary memory or first memory array), a spare memory array 39, a map memory array 41 and a temporary memory array 43. The spare memory array 39, map memory array 41 and/or temporary memory array 43 may be included within the storage control unit 20, may comprise sections of RAM 35 reserved for this purpose or may comprise separate memory units.

The storage control unit 20 is coupled via bus 17 to the map memory array 41 and the temporary memory array 43. In operation, the CPU 12 operates on data from the I/O device 15 in response to commands retrieved from memory, either from ROM 31 or RAM 35 via the storage control unit 20, and also stores data via the storage control unit 20 into RAM 35. Memory cells in each of the memories ROM 31, RAM 35, spare memory array 39, map memory array 41 and temporary memory array 43 include a regular arrangement having a fixed number of dimensions. These dimensions are ordered in some fashion, e.g., page, row and column. Each of these dimensions are then subdivided and numbered, for example, page 1, 2, 3 and the like. This common scheme specifies a regular structure, repeating for some interval. This also allows for easy accessing of data stored in the memory array as the page number, row number and column number are all that is necessary to access memory cells for information storage or retrieval. Because of the regular structure of the memory array, creating a map to direct retrieval or storage to spare memory cell locations in the spare memory array 39 for replacement of defective memory cells in, e.g., RAM 35, is also simplified.

For example, if page 3, row 16, column 32 is the location of a defective storage cell, the map may need only the numbers 3, 16, 32 in order to provide a replacement memory cell. Replacement locations are normally assigned on a first come, first served basis. Thus, for every entry in the map memory array 41, a sequential replacement location may be assigned in the spare memory array 39. While this method allows efficient and easy access to replacement memory cells in the spare memory array 39, certain types of defects consume large amounts of the map memory array 41 storage space.

In the case where errors are not in a random distribution, e.g., burst errors where multiple cells are centered around a particular location, or the loss of an entire dimension in the memory array, such as the loss of an entire row or column, significant efficiencies may be gained in utilization of the map memory array 41 using data compression to reduce the map data size required to store the addresses of the defective memory cells in the map memory array 41 prior to storage. For example, if page 0, row 10, column 13 in RAM memory array 35 had 192 consecutive defective locations on it, starting with the first location, then a simple data compression saving 191 map locations is effected by representing the defects in the RAM memory array 35 with the record 0, 10, 13, 192. This is a relatively primitive approach to data compression, however, it illustrates the basic principle. When more sophisticated compression algorithms are used, greater compression efficiency may be achieved.

In the operation of the computer system 10 of FIG. 1, the storage control unit 20 scrutinizes all memory access requests. When a particular memory access request matches an address encoded in the compressed data stored in the map memory array 41, e.g., as discussed with respect to FIGS. 3 through 5, an address in the spare memory array 39 is substituted for the requested address. This substituted address selects a memory cell from the spare memory array 39 instead of, for example, from RAM 35. This process requires some portion of the data in the map memory array 41 to be decoded from the compressed state (as stored in the map memory array 41), in order to utilize defective cell address data from the map memory array 41.

One way of accomplishing this is to use a hash coding algorithm. During data compression within storage control unit 20, a code word may be generated that points to each defective cell address from the RAM 35 mapped in the map memory array 41. A cyclic code or some other robust process may be used to quickly produce a unique code word for each defective cell address in the primary memory. This code word represents a “hash code” and may be used as an index into the decompressed addresses and their associated hash codes stored in temporary memory array 43.

One way to generate hash codes is to treat the address data as a contiguous series of bits, i.e., as a number. This number is then divided by a prime number, such as 11. The most significant bits of the hash code provide an estimate of the address data and is useful as a quick index to a given number of replacement records in the map memory array 41.

When a hash code matching one of the hash codes stored in the temporary memory array 43 is produced by analysis of the address for the accessed memory cell site, the matching record in the temporary memory array 43 is used to redirect access to the spare memory array 39. When the comparison of the hash code for the address to which access is sought to the hash codes stored in the temporary memory array 43 produces a “miss” i.e., the defective cell addresses in the primary memory array 35 are not available in expanded form in the temporary memory array 43, a wait request may be issued to the CPU 12 while the data stored in the map memory array 41 are decompressed by the storage control unit 20.

Alternatively, an estimate may be made as to the range of memory array addresses required and some of the compressed data from the map memory array 41 may be uncompressed by the storage control unit 20 and then stored in the temporary memory array 43. A least-recently-used algorithm may be used to specify replacement cell addresses from the temporary memory array 43.

Figure 2:
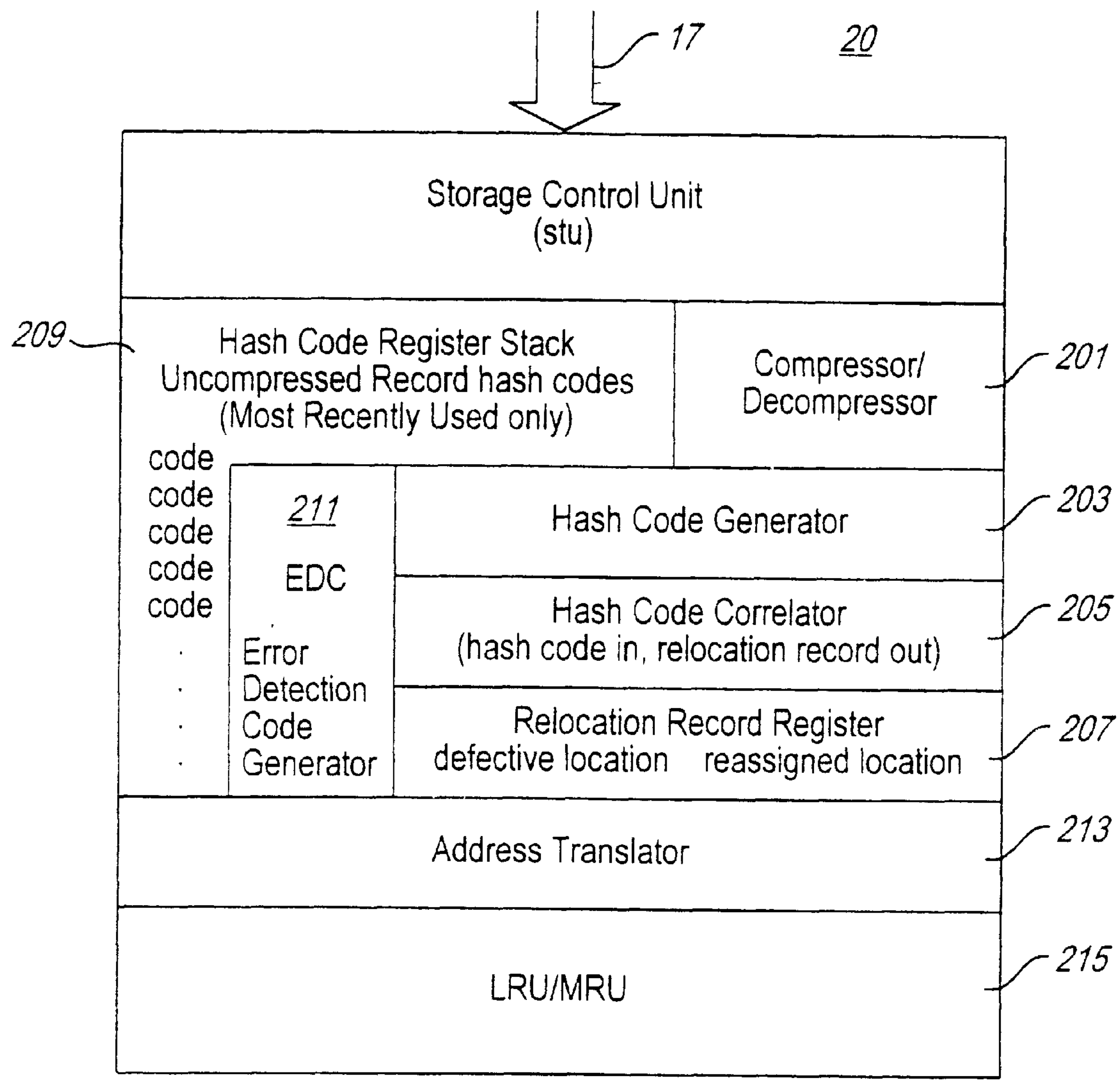
FIG. 2 is a block diagram of the memory storage control unit in a preferred embodiment of the invention.

In a preferred embodiment, the storage control unit 20 of FIG. 1 is realized as illustrated by the block diagram of FIG. 2. A first component 201 acts as a compression engine, to provide compressed data to, and to decompress compressed data from, the map memory array 41. The first component 201 also acts to set a compression flag for the hash code in the hash code storage area of the map memory array 41. A hash code generator 203 generates hash codes from addresses using any known method for providing truncated codes as indices. A hash code correlator 205 takes error location and hash code data and uses the hash code to quickly approximate addresses corresponding to bad cell address data stored in the map memory array 41. A relocation record register 207 stores one relocation record to provide access to relocated data, i.e., data corresponding to the address currently being accessed in spare memory array 39.

A hash code register stack 209 stores hash codes for uncompressed address data from the map memory array 41 that are stored in the temporary memory array 43. The hash code register stack 209 provides quick reference to the storage addresses corresponding to defective memory locations in RAM 35 that have been most recently accessed and includes records for hash codes corresponding to memory locations that are currently stored in an uncompressed state, for example, in temporary memory array 43. An error detection code generator 211 provides and stores a check code every time a memory location is accessed for a write operation. When the same memory location is read, another check code is generated and is compared with the earlier check code generated during the write operation. When the two code words differ, an error has occurred. The error check operation may be implemented using any known method, including methods as simple as parity checking or as thorough as the Reed-Solomon technique.

The storage control unit 20 then analyzes the address to determine if it is the address of a location known to have failed, using a hash code that is calculated when a memory cell test indicates a defective memory cell. When there is a match between the hash code for the current address to which access is sought and a stored hash code in the storage control unit 20, the storage control unit 20 fetches the relocation record from the relocation record register 207 using the using the address as a key, obtains the address in the spare memory array assigned to the requested address and substitutes this spare memory array address for the requested address. When there is no match between the hash code for the current address to which access is sought and a stored hash code in the storage control unit, the current address is treated as an address for a defective memory cell as described with reference to the initial memory testing (see FIGS. 3–5 and associated text). In either case, an address translator 213 passes the correct address in the spare memory array 39 to the bus 17. A least-recently-used/most-recently used register 215 maintains counts to accesses to hashed locations, i.e., to accesses to addresses within the spare memory array 39.

While FIG. 2 shows the computer system 10 as implementing the storage control unit 20 as a stand-alone unit, it will be appreciated that storage control unit 20 or one or more of the associated functions may be implemented in a number of other ways. For example, one or more of the functions of the storage control unit 20 may be included in software or in instructions contained in the ROM 31 and executed by the processor 12. Alternatively, one or more of the functions of the storage control unit 20, the spare memory array 39, the map memory 41 and the temporary memory array 43 may be implemented in the integrated circuit(s) comprising RAM 35.

Figure 3:
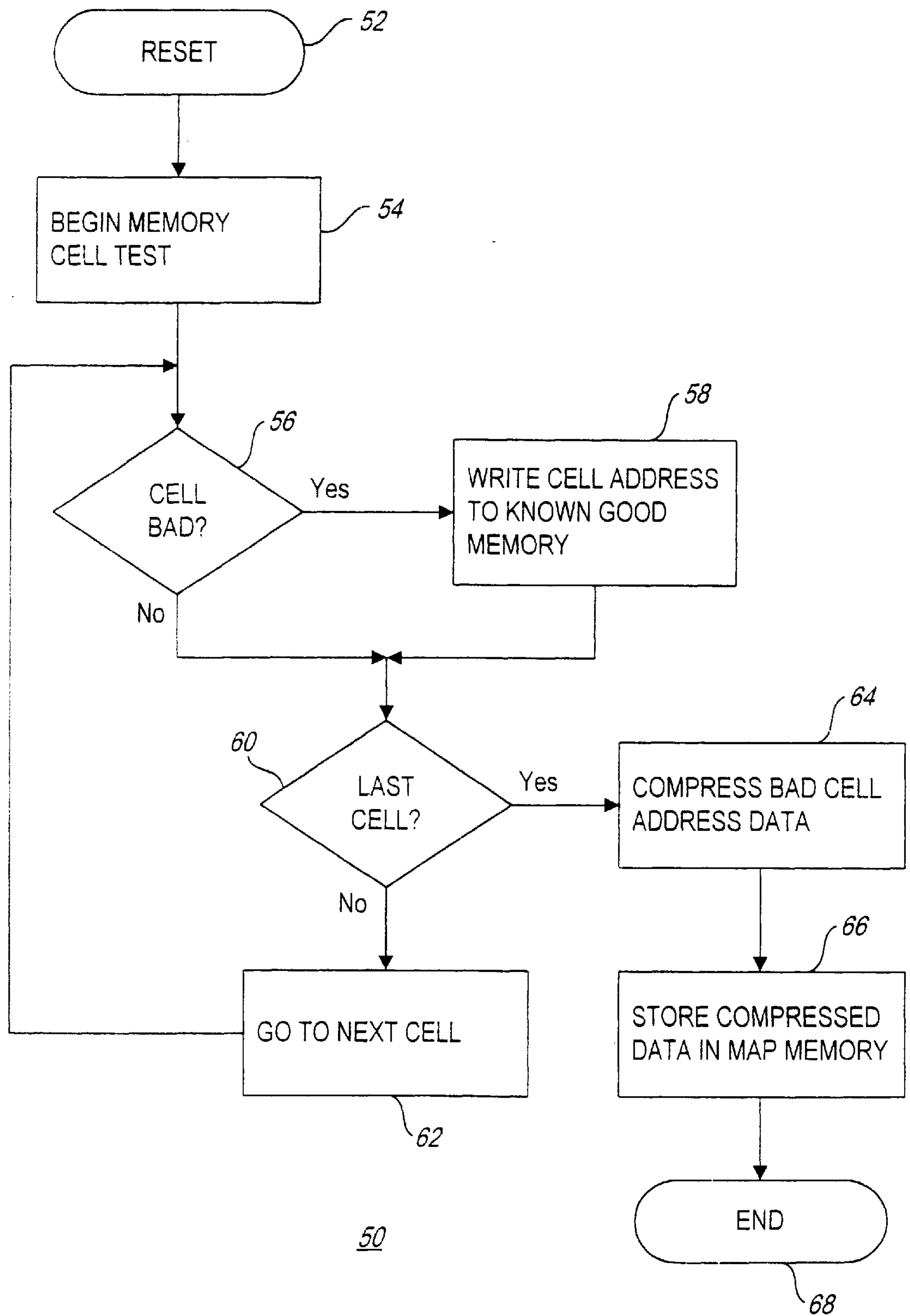
FIG. 3 is a flowchart of a process for testing a memory array in accordance with another embodiment of the invention.

FIG. 3 is a flow chart of a process 50 for testing a memory array to generate addresses of defective memory array cells in, for example, RAM 35, for compressing data describing defective memory array cell locations and for storing the compressed data describing defective memory array cell locations in the map memory array 41. Generally, the process 50 may be invoked on any sort of power on, reset or boot operation in step 52, or in response to other criteria such as a memory test command. Memory array cell testing begins in step 54 and then a query task 56 is invoked to determine if a given cell is defective. When the given cell is not defective, control passes to a query task 60 to determine whether or not that cell is the last cell to be tested. When the cell tested in the query task 56 is defective, the cell address is written to a temporary memory that is known to operate properly in step 58. Control then passes to the query task 60 again. When this is not the last cell to be tested, the process 50 advances to the next cell in step 62 and reinitiates the query task 56.

When the query task 60 determines that the last cell in the array has been tested, defective memory array cell address data are compressed in step 64, for example, via the storage control unit 20 of FIG. 1. The compressed data are stored in the map memory array 41 in step 66. The process 50 then ends in step 68.

The process 50 thus tests, for example, all memory locations in RAM 35 during a power on or reset operation, or any other type of reset operation (or in response to a memory test command). The process 50 gleans information describing defective memory array cell address data for RAM 35, compresses those data and then stores the compressed data in the map memory array 41.

Figure 4:
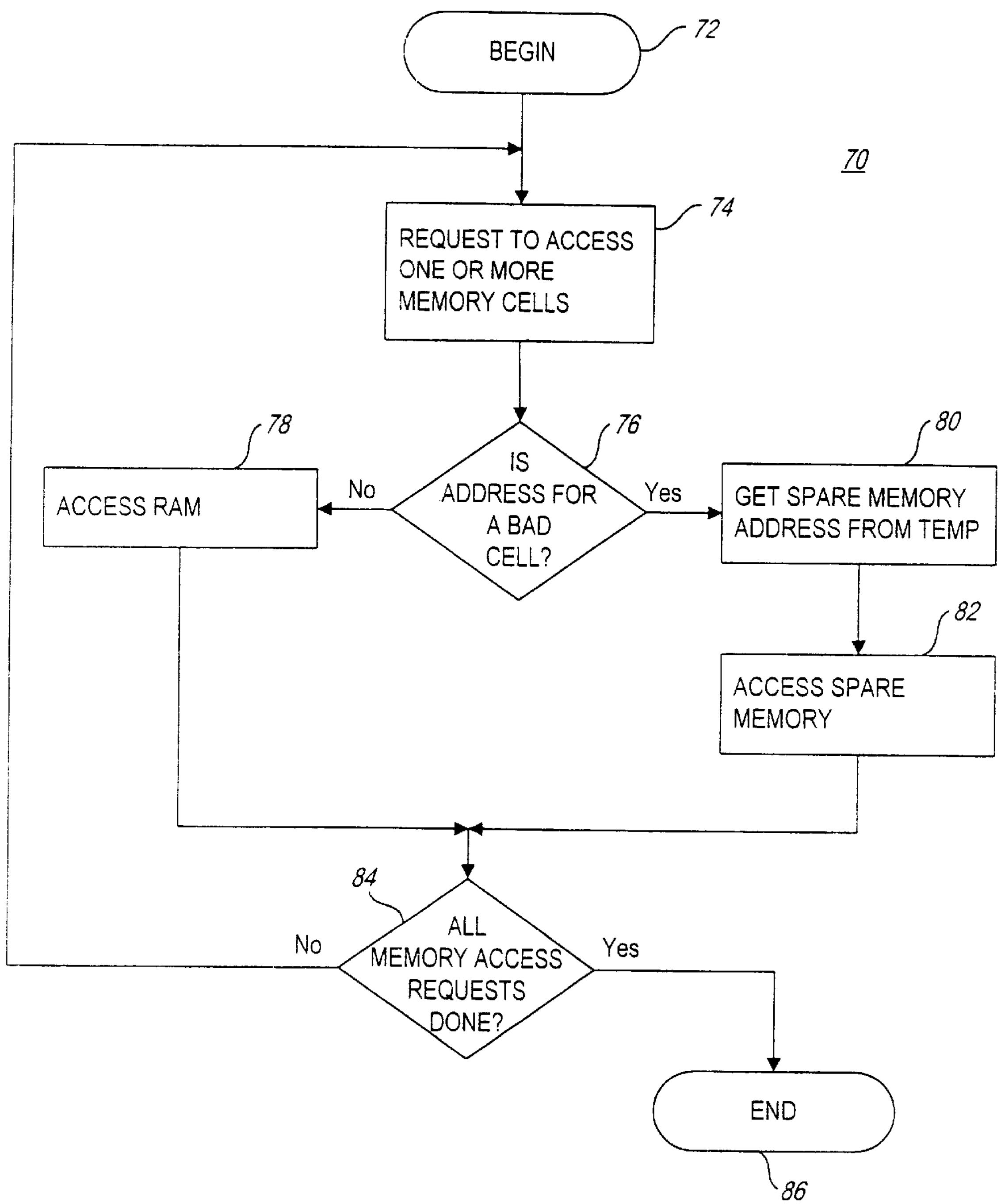
FIG. 4 is a flowchart of a process for accessing primary and spare memory array cells in accordance with yet another embodiment the invention.

FIG. 4 is a flow chart of a process 70 for processing memory array address requests. The process 70 begins in step 72 with a request to access one or more memory array cells in step 74. In a query task 76, the storage control unit 20 determines if the address to which access has been requested is for a defective memory array cell. This is discussed in more detail below with reference to FIG. 5. When the query task 76 determines that the address does not correspond to a defective memory array cell in, for example, RAM 35, RAM 35 is accessed in step 78. Control then passes to a query task 84 to determine whether or not all memory array access requests have been executed. When all memory array access requests have been executed, the process 70 ends in step 86. When not all memory array access requests have been processed, control passes to request access to one or more memory array cells in step 74.

When the query task 76 determines that a requested address is for a defective memory array cell, a spare memory array address is obtained from the temporary memory array 43 in step 80, and a cell in the spare memory array 39 is accessed in step 82. Control then passes to the query task 84 to determine whether or not all memory array access requests have been executed.

Figure 5:
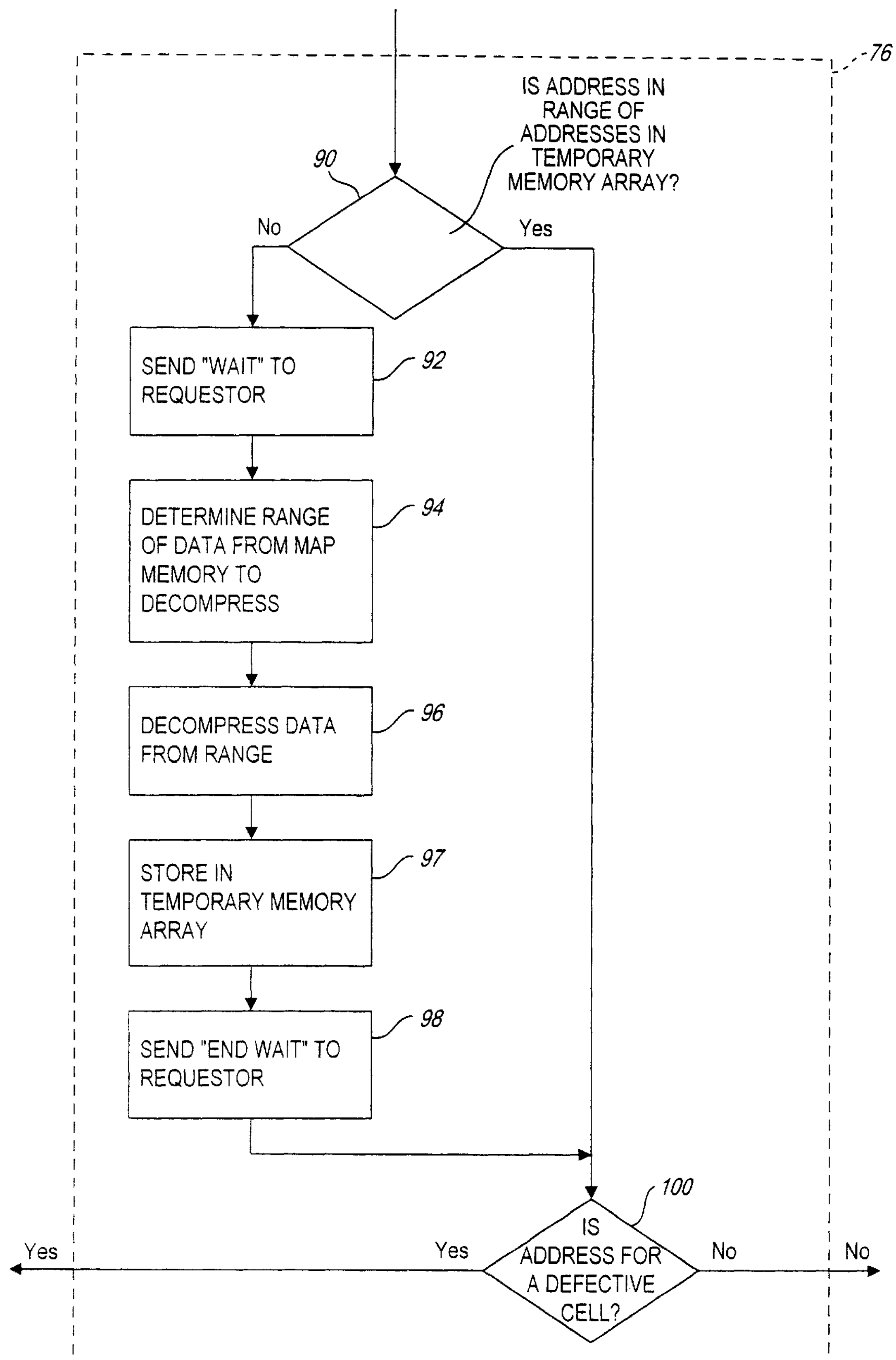
FIG. 5 is a flowchart of a portion of the process of FIG. 4, where the portion determines when a given memory cell location is defective.

FIG. 5 is a flow chart showing the query task 76 in more detail. The query task 76 begins with a query task 90 to determine if the address is in a range of addresses stored in the temporary memory array 43. When the requested address is in the range of addresses stored in the temporary memory array 43, control passes to a query task 100 to determine if the requested address corresponds to a defective memory array cell. The "yes" and "no" options of the query task 100 correspond to the "yes" and "no" options shown with query task 76 of FIG. 4.

When the address that is requested is not in the range of the temporary addresses stored in the temporary memory array 43, an optional "wait" signal may be passed in step 92 to the unit requesting memory access, such as the CPU 12 of FIG. 1. In one embodiment, a range of data to be decompressed from the map memory array 41 are estimated in step 94, and data falling within this range are decompressed in step 96 via the storage control unit 20 of FIG. 1. The decompressed address data are stored in step 97 in the temporary memory array 43 of FIG. 1. An optional "end wait" signal may then be sent in step 98 to the unit requesting memory access, for example, the CPU 12. Control then passes back to the query task 100 to determine if the requested address corresponds to one of the decompressed addresses for defective memory cells stored in the temporary memory array 43.

The invention as described may allow a memory array to be operated more efficiently by reducing the number of memory cells needed in order to store a map of defective memory cells in the memory array. It may be integrated into a memory chip, implemented in software or by discrete components or it may be employed together with memory devices in a larger system.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for accessing a memory array, the method comprising steps of:

receiving an address for access to one or more cells of a first memory array;

analyzing the address to determine whether the address matches an uncompressed address in a temporary memory array, and, when the address does not match any uncompressed address stored in the temporary memory array, the method includes steps of:

analyzing the address to determine which portion of compressed data stored in a third memory array containing compressed addresses of defective cells in the first memory array to decompress;

decompressing the portion of compressed data to provide expanded data;

writing the expanded data to the temporary memory array;

comparing the expanded data to the address to determine when the address corresponds to an expanded datum of the expanded data;

routing the address to a second memory array when the address and a datum from the decompressed data match; and accessing the second memory array via the address.

2. A method as claimed in claim 1, further including a step of routing the address to the first memory array when the comparing step determines that the address does not match any datum from the decompressed or compressed data.

3. A method as claimed in claim 1, wherein the step of accessing the second memory array includes a step of reading data via the address.

4. A method as claimed in claim 1, wherein the step of accessing the second memory array includes a step of writing data via the address.

5. A method as claimed in claim 1 wherein the step of routing the address to a second memory array comprises a step of routing the address to a separate portion of the first memory array when the address and a datum from the decompressed data match.

6. A method for accessing a memory array, the method comprising steps of:

receiving a memory array access request including a requested address;

generating a first hash code from the requested address;

comparing the first hash code to hash codes for decompressed addresses stored in a temporary memory array;

determining if an address stored in the temporary array corresponds to the requested address when a match is found between a hash code for a decompressed address and the first hash code; and routing the memory array access request to a spare memory array when an address stored in the temporary array corresponds to the requested address.

7. A method as claimed in claim 6, wherein, when the comparing step indicates that no match is found between the first hash code and the hash codes for decompressed addresses stored in the temporary memory array, the method includes steps of:

determining which portion of a map memory array to decompress, the map memory array storing compressed addresses of defective memory array cells in a first memory array;

decompressing compressed data from the portion to provide decompressed addresses; and storing the decompressed address in the temporary memory array.

8. A method as claimed in claim 7, wherein the step of decompressing compressed data includes a step of generating a hash code for each decompressed address, and wherein the method further comprises a step of comparing the first hash code to the hash codes for the decompressed addresses stored in the temporary memory array.

9. A method as claimed in claim 8 wherein, when a match is found between a hash code for a decompressed address and the first hash code, the method includes a step of routing the memory array address request to the spare memory array.

10. A method as claimed in claim 9, further comprising a step of sending a wait command prior to said step of determining which portion of a map memory array to decompress.

11. A method as claimed in claim 10, further comprising a step of sending a cancel wait command prior to said step of routing the memory array address request to the spare memory array.

12. A method as claimed in claim 9 wherein, when no match is found between the first hash code and the hash codes for the decompressed addresses stored in the temporary memory array, the method includes steps of:

sending a cancel wait command; and routing the memory array access request to the first memory array.

13. A method as claimed in claim 12 wherein:

the step of receiving a memory array access request includes a step of receiving a memory array access request including a requested address from a processor;

the step of sending a wait command includes a step of sending a wait command to the processor; and the step of sending a cancel wait command includes a step of sending a cancel wait command to the processor.

14. A method for accessing cells in a memory array, the method comprising steps of:

receiving a request for accessing an address;

analyzing the address to determine when the address matches an address stored in a temporary memory array, and, when the address does not match any address stored in the temporary memory array, performing steps of:

analyzing the address to determine which portion of compressed data stored in a map memory array containing compressed addresses of defective cells in a first memory array to decompress;

decompressing the portion of compressed data to provide expanded data;

writing the expanded data to the temporary memory array; and comparing the expanded data to the address to determine when the address corresponds to an expanded datum of the expanded data, when the address and the expanded datum match, accessing a spare memory array via the address.

15. A method as claimed in claim 14, further comprising a step of routing the address to a first memory array when the address does not match any address stored in the temporary memory array or to an expanded datum of the expanded data.

16. A method as claimed in claim 14, further comprising a step of routing the address to a second memory array when the step of analyzing the address determines that the address matches an address stored in the temporary memory array.

17. A memory control circuit comprising:

storage control unit means coupled to a bus, the storage control unit means for accessing memory array units to retrieve data from a first memory array unit in response to memory array access requests delivered via the bus;

first memory array means coupled to the storage control unit means, the first memory array means for storing data;

second memory array means coupled to the storage control unit means, the second memory array means for replacing cells determined to be defective in the first memory array means; and means for compressing data describing memory array addresses corresponding to cells determined to be defective in the first memory array means to provide compressed addresses and for decompressing compressed addresses to provide decompressed addresses, the compressing means coupled to the storage control unit means.

18. A memory control circuit as claimed in claim 17, further comprising third memory array means for storing the compressed addresses, the third memory array means coupled to the compressing means.

19. A memory control circuit as claimed in claim 18, further comprising fourth memory array means coupled to the storage control unit means, the fourth memory array means for temporarily storing the decompressed addresses from the compressing means.

20. A memory control circuit as claimed in claim 19 wherein the first, second, third and fourth memory array means comprise random-access memories.

21. A memory control circuit as claimed in claim 19 wherein the compressing means is for:

identifying a starting and an ending address for a group of adjacent defective cell sites in the first memory array means;

reconfiguring the addresses of the group as the starting address and a difference between the starting address and the ending address to provide compressed addresses; and supplying the compressed addresses to the third memory array means.

22. A memory control circuit as claimed in claim 21 wherein the compressing means is further for:

accepting addresses of a group of adjacent addresses describing defective cell sites in the first memory array means as a starting address and a difference between the starting address and the ending address; and reconstructing individual addresses of the defective cell sites to provide decompressed addresses.

23. A memory control circuit as claimed in claim 21 wherein the compressing means is additionally for writing the decompressed addresses to the fourth memory array means.

24. A memory control circuit as claimed in claim 17 wherein the storage control unit means, the first memory array means, the second memory array means, the compressing means and the third memory array means comprise an integrated circuit.

25. A memory control circuit as claimed in claim 24, wherein the storage control unit, the first memory array, the second memory array, the data compressor and the third memory array comprise an integrated circuit.

26. A memory control circuit comprising:

a storage control unit coupled to a bus, the storage control unit for accessing memory array units to retrieve data from a first memory array unit in response to memory array access requests delivered via the bus;

a first memory array coupled to the storage control unit, the first memory array for storing data;

a second memory array coupled to the storage control unit, the second memory array for replacing cells determined to be defective in the first memory array; and a data compressor that compresses data describing memory array addresses corresponding to cells determined to be defective in the first memory array to provide compressed addresses and that decompresses compressed addresses to provide decompressed addresses, the data compressor coupled to the storage control unit.

27. A memory control circuit as claimed in claim 26, further comprising a third memory array for storing the compressed addresses, the third memory array coupled to the data compressor.

28. A memory control circuit as claimed in claim 27, further comprising a fourth memory array coupled to the storage control unit, the fourth memory array for temporarily storing the decompressed addresses from the data compressor.

29. A memory control circuit as claimed in claim 28 wherein the first, second, third and fourth memory arrays comprise random-access memories.

30. A memory control circuit as claimed in claim 28 wherein the data compressor identifies a starting and an ending address for a group of adjacent defective cell sites in the first memory array, reconfigures the addresses of the group as the starting address and a difference between the starting address and the ending address to provide compressed addresses and supplies the compressed addresses to the third memory array.

31. A memory control circuit as claimed in claim 30 wherein the data compressor further accepts addresses of a group of adjacent addresses describing defective cell sites in the first memory array as a starting address and a difference between the starting address and the ending address and reconstructs individual addresses of the defective cell sites to provide decompressed addresses.

32. A memory control circuit as claimed in claim 30 wherein the compressing means is additionally for writing the decompressed addresses to the fourth memory array.

33. A computer comprising:

a processor;

a read-only memory storing instructions for operation of the processor;

a random-access memory array storing data;

a spare random-access memory array storing data corresponding to defective locations in the random-access memory array;

a storage control unit coupled to the processor, the read-only memory, the random-access memory and the spare random-access memory, the storage control unit accessing the read-only memory, the random-access memory and the spare random-access memory to retrieve data in response to commands from the processor; and a data compressor coupled to the storage control unit, the data compressor compressing data indicative of addresses of defective storage locations in the random access memory array to provide compressed addresses, and decompressing the compressed addresses.

34. A computer as claimed in claim 33 wherein the data compressor comprises the processor executing instructions stored in the read-only memory.

35. A computer as claimed in claim 33 wherein the data compressor comprises circuitry incorporated within the storage control unit.

36. A computer as claimed in claim 33 wherein the data compressor comprises circuitry incorporated within the random-access memory array.

* * * * *